United States Patent
Liao et al.

(10) Patent No.: US 8,981,971 B2
(45) Date of Patent: Mar. 17, 2015

(54) WAVELET-BASED SEISMIC DATA COMPRESSION

(71) Applicant: Total E&P Research & Technology USA, Inc., Houston, TX (US)

(72) Inventors: Qingqing Liao, Katy, TX (US); Fuchun Gao, Katy, TX (US); Christian Rivera, Houston, TX (US)

(73) Assignee: Total E&P Research & Technology USA, Inc., Houston, TX (US)

( * ) Notice: Subject to any disclaimer, the term of this patent is extended or adjusted under 35 U.S.C. 154(b) by 0 days.

(21) Appl. No.: 14/224,916

(22) Filed: Mar. 25, 2014

(65) Prior Publication Data

US 2014/0292549 A1    Oct. 2, 2014

Related U.S. Application Data

(60) Provisional application No. 61/805,840, filed on Mar. 27, 2013.

(51) Int. Cl.
*H03M 7/30* (2006.01)

(52) U.S. Cl.
CPC ............. *H03M 7/3059* (2013.01); *H03M 7/30* (2013.01)
USPC ................... 341/87; 367/43; 367/46; 367/52; 367/63; 367/74; 375/240; 375/249; 375/295; 382/232; 382/233; 382/239

(58) Field of Classification Search
CPC ............ H03M 7/30; G01V 1/28; G01V 1/38; G01V 1/364; G06F 17/00
USPC .......... 341/80–90; 367/43, 46, 52, 63, 74, 76; 375/240, 249, 295; 382/232, 233, 239, 382/244, 245, 248
See application file for complete search history.

(56) References Cited

U.S. PATENT DOCUMENTS

| | | | | |
|---|---|---|---|---|
| 3,860,759 A | * | 1/1975 | Miller et al. | 367/14 |
| 4,509,150 A | * | 4/1985 | Davis | 367/76 |
| 5,084,844 A | * | 1/1992 | Wang | 367/59 |
| 5,745,392 A | * | 4/1998 | Ergas et al. | 708/203 |
| 6,594,394 B1 | * | 7/2003 | Stromberg et al. | 382/232 |
| 6,826,227 B1 | * | 11/2004 | Duval et al. | 375/240 |
| 6,853,922 B2 | * | 2/2005 | Stark | 702/14 |

OTHER PUBLICATIONS

R. R. Coifman, Y. Meyer, V. Wickerhauser, Process in Wavelet Analysis and Application, Proceedings of the International Conference "Wavelets and Applications", 1992, pp. 77-93, Y. Meyer and S. Rogues, editors, Toulouse, France.

(Continued)

*Primary Examiner* — Lam T Mai
(74) *Attorney, Agent, or Firm* — Gary L. Bush; Andrews Kurth LLP (57) ABSTRACT

This invention is for a method for transforming a seismic trace into a compressed domain. The seismic source wavelet is transformed into a zero degree phase wavelet and a shifted 90 degree phase wavelet, and the two wavelets span a 2-dimensional sub-space. A dictionary is created by collecting the wavelets in the sub-space. In practice this dictionary is usually combined with conventional existing wavelet dictionaries. The seismic trace is projected onto the dictionary (sub-space alone or combined) to find the best matching projection, with a residual determined after each projection, wherein the sum of the residuals determines the fidelity of the data compression.

5 Claims, 4 Drawing Sheets

(56) References Cited

OTHER PUBLICATIONS

R. A. Devore, B. Jawerth and B. J. Lucier, Image Compression Through Wavelet Transform Coding. IEEE Transactions on Information Theory, 1992, vol. 38, No. 2, pp. 719-746.

J. Lu, V. R. Algazi and R. R. Estes,Jr., Comparative Study of Wavelet Image Coders, Optical Engineering, 35(9), 1996, pp. 2605-2619.

P. Mathieu, M. Barlaud and M. Antonini, Compression d'Images Par Transformee en Ondelette et Quantification Vectorielle. Traitment du Signal, 1990, 7(2), pp. 101-115.

P. L. Donoho, R. A. Ergas and J. D. Villasenor, High-Performance Seismic Trace Compression. SEG Annual Meeting, Extended Abstract, 1995, pp. 160-163.

E. Reiter and M. Hall, A Comparison of Multi-dimensional Wavelet Compression Methods. EAGE 58th Conference and Technical Exhibition, 1996.

I. Daubechies, Ten lectures on wavelets, 1992, SIAM. http://books.google.com/books?id=Nxnh48rS9jQC&pg=PA53&source=gbs_toc_r&cad=3#v=onepage&q&f=false.

S. G. Mallat and Z. Zhang, Matching Pursuits With Time-Frequency Dictionaries, IEEE Transactions on Signal Processing, 1993, vol. 41, No. 12.

W. Wang and P. Mishra, A Partitioned Bitmask-Based Technique for Lossless Seismic Data Compression, CISE Technical Report 08-452, University of Florida, 2008.

J. Lu, V. Algazi, R. Estes, Jr., "A Comparative Study of Wavelet Image Coders," Center for Image Processing and Integrated Computing (CIPIC), pp. 1-34, Davis: University of California, 1996.

Belkin et al., "Wavelet transforms and compression of seismic data", (Aug. 1998), retrieved from the internet at http://amath.colorado.edu.faculty/beylkin/paper/compr.pdf (see entire document).

Iliescu et al., "Wavelet transform filtering of seismic data by semblance weighting", (2000), retrieved from the internet at http://amath/colorado.edu/faculty/beylkin/papers/compr.pdf (see entire document).

Search Report & Written Opinion (PCT/US2014/031774), dated Aug. 29, 2014.

\* cited by examiner

WAVELET-BASED SEISMIC DATA COMPRESSION

This application claims priority from Provisional Patent Application 61/805,840 filed Mar. 27, 2013.

BACKGROUND OF THE INVENTION

1. Field of the Invention

This invention concerns data compression in general and specifically to seismic data compression.

2. Description of the Prior Art

Seismic data is collected for monitoring of earthquakes and energy explorations and is collected by a series of seismometers placed at different locations. Seismic exploration of the earth's crust is used extensively not only on land but also offshore to identify oil and gas deposits in subterranean earth formations.

The motivation of compressing seismic data is that it takes enormous storage space and demands considerable transmission bandwidth to transfer the data from a seismic measuring location to a central processing location. Also for many situations where real time data processing is required, data compression is the key since it is possible only if the data are transmitted very quickly. In a modern 2D seismic acquisition survey, in which data is acquired by generating a loud sound at one location and recording at a receiver the resulting vibrations in the earth at another location, up to 100 terabytes of data may be recorded. That number increases in the range of multiple hundreds of terabytes due to acquisition of 3D or 4D surveys instead of a traditional 2D one, and emerging new techniques in data acquisition such as wide azimuth and full azimuth acquisitions. Therefore, seismic data compression is desirable in order to save storage space and transmission time.

For data compression, widely accepted metrics for measuring compression efficiency are defined as, $$\text{compression} = \frac{\text{Uncompressed Size}}{\text{Compressed Size}}$$

$$\text{compression ratio } (CR) = \frac{\text{Compressed Size}}{\text{Uncompressed Size}}$$

These two measures are reciprocal to each other. The compression ratio is usually shown in percentage.

For seismic data compression methods such as the wavelet based approaches, data loss can occur such that the decompressed data is usually slightly different from the original data. The difference between them (i.e., data residual) is a measure of compression quality. For the same compression quality, the larger the compression, the better compression that results.

There have been many approaches regarding seismic data compression. Different transformations, filters and coding schemes have been used to achieve great compression but with a certain level of precision. These techniques exploit similarities of different pieces of seismic data, find approximate image partitions, condense information, and reduce statistical redundancy. However, there is hardly any absolute repetition (of the entire 32-bit vector) even if millions of different data traces are analyzed. In order to maintain zero precision loss, those differences cannot be simply ignored or rounded. Lossless compression methods have also been proposed, and most of them have used linear prediction as the major step. But they either require huge memory or high computational complexity.

In the code compression for embedded systems area, there is an efficient and lossless compression technique called the bitmask-based method. It uses dictionary-based compression to exploit existing repetitions as well as bitmask-matched repetitions by remembering the differences. Due to the similar precision requirement in seismic data compression, the bitmask-based approach was once expected to be very promising. Unfortunately, as reported in the CISE Technical Report 08-452, Wang, Mishra, University of Florida, 2008, direct application of the bitmask-based technique resulted in poor compression primarily due to the fact that there is rarely useful repetition in seismic data.

To obtain higher compression performance, wavelet-based methods, which are lossy, are usually adopted, mainly because wavelet-based methods can provide good localization in both time and frequency, resulting in the energy compact which is essential for a high compression ratio. Wavelet-based data compression has been an active research topic in the last two decades: for example, Coffman et al., Wavelet Analysis and Signal Processing; Proceedings of the International Conference "Wavelets and Applications", Y. Meyer and S. Rogues, editors, Toulouse, France, 1992, Pages 77-93, 1992;

Devore et al., Image compression through wavelet transform coding. IEEE Transactions on Information Theory, 38:719-746, 1992;

Lu et al., Comparative study of wavelet image coders, Optical Engineering, 35(9), 2605-2619, 1996; and Mathieu et al., Compression d'images par transformee en ondelette et quantification vectorielle. Traitment du Signal, 7(2) :101-115, 1990.

The history of wavelet-based seismic data compression can be dated back to mid-1990, for example, Donoho et al., High-performance seismic trace compression. In Proceedings of SEG, p. 160-163, 1995; and Reiter and Hall, A comparison of multi-dimensional wavelet compression methods. In Proceedings of EAGE, 1996.

Seismic data compression presents more difficulties than still image compression, due to certain image discontinuities (e.g., residual statics) and large amplitude imbalances. So far, various wavelet based seismic data compression methods have achieved different compression ratios, and has been used for data visualization, data transmission as well as seismic imaging algorithms, among other possible applications.

3. Identification of Objects of the Invention

In the past, most wavelet-based seismic data compression algorithms have concentrated on either different wavelet types as basis wavelets or on the different encoding/quantization approaches in compression. It is an object of this invention to take advantage of the fact that the seismic signals in one shot gather actually all evolve from one common source wavelet in an active seismic survey.

SUMMARY OF THE INVENTION

This invention recognizes that in seismic data, the signal wavelets in a typical shot gather of seismic data evolve from the same source wavelet initiated at one source location. Therefore the signal wavelets can be regarded as the phase-rotated version of one common source wavelet. Due to the phase-rotation, the shapes of the signal wavelets are different from that of the source wavelet. The phase-rotation is from the fact that the earth media, where the seismic waves propagate, act as filters which change the phase and amplitude of the source wavelet. Since the signal wavelets are a phase-rotated version of one common source wavelet, a signal wavelet can be represented as the linear combination of the zerodegree-phase and the 90-degree-phase of source wavelets which form a 2-dimensional sub-space, if the source wavelet is known.

In a marine seismic survey, the source wavelet is known, because it is recorded at the acquisition boat. In land data, the source wavelet can be reliably estimated. Since it is known, the zero-degree-phase and 90-degree-phase source wavelets can be easily derived. These derived zero degree and 90 degree source wavelets are added into the dictionary of basis wavelets for data compression. The quality of data compression is improved, because the dictionary has been educated according to the characteristics of the signals to be compressed.

This invention is for a method for transforming a seismic trace f(t) in response to a seismic source wavelet I(t) into a compressed domain comprising the steps of transforming said seismic source wavelet I(t) into
a zero-degree phase wavelet $\Phi_p(t)$ and
a shifted 90 degree phase wavelet $\Psi_p(t)$,
and the two wavelets span a two dimensional sub-space, creating a sub-space dictionary as $$D_s = \{(\Phi_p, \Psi_p)\} p \in \Gamma$$

where $\Gamma$ is a set of wavelets which are derived using the two wavelets that span the 2D sub-space,
projecting said seismic trace f(t) onto
said dictionary $D_s$ to find the best matching projection, with a residual determined after each projection matching,
wherein the sum of said residuals determines the fidelity in data compression.

If necessary, the sub-space dictionary is added into a conventional existing wavelet dictionary such as the Symlets.

The method is further described wherein, $R^m f$ represents the residual after the m-th projection, with $R^0 f = f$, the initial residual being the seismic trace f(t) itself, and the m-th order residual $R^m f$ computed from m≥0, where $(\Phi_{pm}, \Psi_{pm}) \in D_s$,
finding a sub-set of the input wavelet $\Phi_p, \Psi_p$ in the dictionary $D_s$ such that the m-th order residual has the biggest energy projected thereon such that, $|<R^m f, \Phi_{pm}>| + |<R^m f, \Psi_{pm}>| = \max(|<R^m f, \Phi_p>| + |<R^m f, \Psi_p>|), p \in \Gamma$, projecting $R^m f$ on $(\Phi_{pm}, \Psi_{pm})$, wherein $R^m f = <R^m f, \Phi_{pm}> \Phi_{pm} + <R^m f, \Psi_{pm}> \Psi_{pm} + R^{m+1} f$, stopping at the m-th iteration when the norm of the residual satisfies $\|R^m f\| < \epsilon$ where $\epsilon$ is a predefined small positive value, and the seismic trace is represented by $$f = \sum_{m=0}^{M-1} (\langle R^m f, \phi_{pm} \rangle \phi_{pm} + \langle R^m f, \Psi_{pm} \rangle \Psi_{pm}) + R^M f.$$

DESCRIPTION OF EMBODIMENTS OF THE INVENTION

The invention is called sub-space matching pursuit. The theoretical background of it is introduced in the following.

Let $\Gamma$ be an index set and $D_s = \{(\Phi_p, \Psi_p)_{p \in \Gamma}\}$ be a sub-space dictionary with $\Phi_p$ as a shifted zero-degree-phase source wavelet and $\Psi_p$ as a shifted 90-degree-phase wavelet.

A trace from a seismic dataset can be treated as a vector which is to be represented by using the wavelets in the dictionary. One of the methods to find such a representation is called matching pursuit, which is a projection method by which the best matching projection of the trace onto the dictionary can be found at each iteration (Mallat and Zhang, 1993, Matching pursuits with time-frequency dictionaries. IEEE Trans. Signal Process., 41, No. 12, 3397-3415). After one iteration, part of the signals in the trace have been represented by using the dictionary, and the remaining will be further represented in the following iterations until the representation of the whole trace is good enough.

Let Rf denote the residual after one matching pursuit projection and $R^m f$ is the residual after m-th projection. Let $R^0 f = f$, i.e., the initial residual is the trace itself. Suppose that the m-th order residue $R^m f$ is already computed from m≥0. The next iteration chooses $(\Phi_{pm}, \Psi_{pm}) \in D_s$ such that $$|\langle R^m f, \phi_{pm} \rangle| + |\langle R^m f, \Psi_{pm} \rangle| = \max_{p \in \Gamma}(|\langle R^m f, \phi_p \rangle| + |\langle R^M f, \Psi_p \rangle|). \quad (1)$$

Equation (1) implies that a sub-set of the basis wavelets is found in the dictionary that the m-th order residual has the biggest energy projected onto,
and projects $R^m f$ on $(\Phi_{pm}, \Psi_{pm})$:

$$R^m F = <R^m f, \Phi_{pm}> \Phi_{pm} + <R^m f, \Psi_{pm}> \Psi_{pm} + R^{m+1} f, \quad (2)$$

The calculation stops at the m-th iteration when the norm of the residual satisfies $\|R^m f\| < \epsilon$, where $\epsilon$ is a predefined small positive value.

Summing up equation (2) over index m between 0 and M−1 results in, $$f = \sum_{m=0}^{M-1} (\langle R^m f, \phi_{pm} \rangle \phi_{pm} + \langle R^m f, \Psi_{pm} \rangle \Psi_{pm}) + R^M f. \quad (3)$$

The sub-space dictionary can be combined with existing well-known wavelet dictionaries such as Symlets $\{\omega_p\}$ which are a modified version of Daubechies wavelets (Daubechies, Ten lectures on wavelets, SIAM, 1992) with increased symmetry. Next, data compression is achieved by matching pursuit using the combined dictionary $D_c = \{\omega_p, \Phi_p, \Psi_p\}$.

This invention is based on one observation of seismic wave phenomenon that the wavelets in the recorded signals are the phase-rotated version of one common source signature which we do have knowledge of. Thus instead of only using a dictionary that is purely computed in a certain theoretical framework, the dictionary according to the invention is educated according to the signals to be compressed. Thus the signals in data can be better represented by using this dictionary, which we will show below. Here we introduced the concept of sub-space method to educate the dictionary.

So far we have shown that 2-dimensional sub-space method works, which proves the concept. The invention also includes any higher dimensional sub-space method. For example, the method can be extended into 3-dimensional sub-space with the third dimension being frequency, as a natural extension from 2D to 3D.

Figure 1:
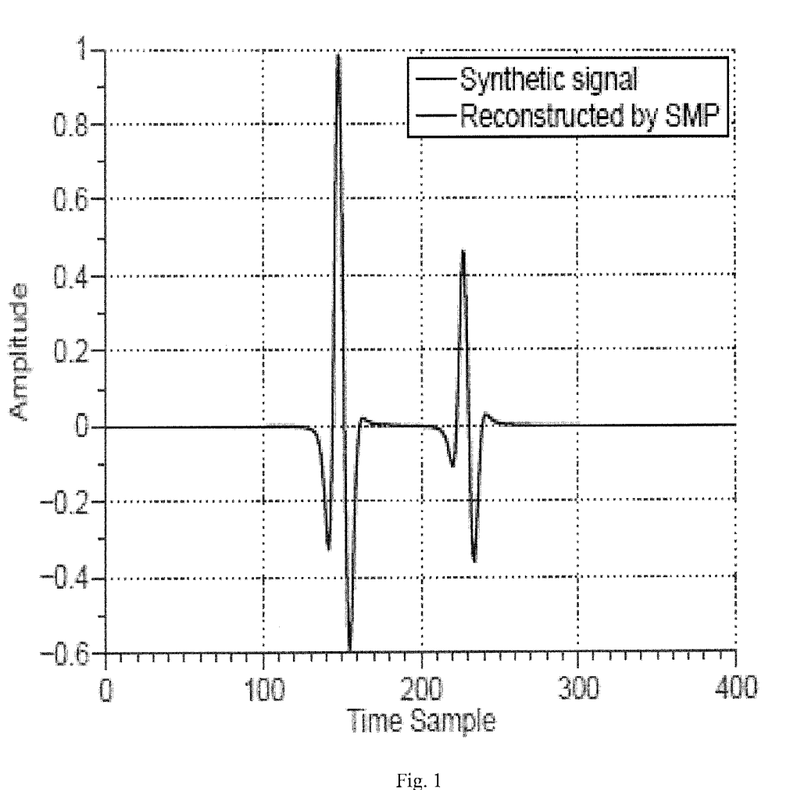
FIG. 1 illustrates the sub-space matching pursuit showing that the reconstructed signal and original signal agree perfectly.

To validate the methodology of sub-space matching pursuit, an example is presented. First a synthetic trace is generated by summing up a 30-degree and 60-degree rotated Ricker wavelet as shown in FIG. 1. After 2 iterations, the residual became insignificant. As a result, only 4 coefficients and 2 indices are needed to store the compressed signal and to reconstruct the original signal. As can be seen, the reconstructed signal overlaps exactly with the original one. A compression of 100:1 is achieved in this case.

Next, an example is presented to compare the different performances of three methods in data compression: (1) the matching pursuit with Symlets which is the conventional method; (2) the sub-space matching pursuit; (3) the matching pursuit with combined dictionaries of sub-space and Symlets. First a synthetic shot gather was generated using a Ricker wavelet as the source wavelet. The shot record has 220 traces and each has 1001 samples with a simple rate of 8 ms.

Figure 2A:
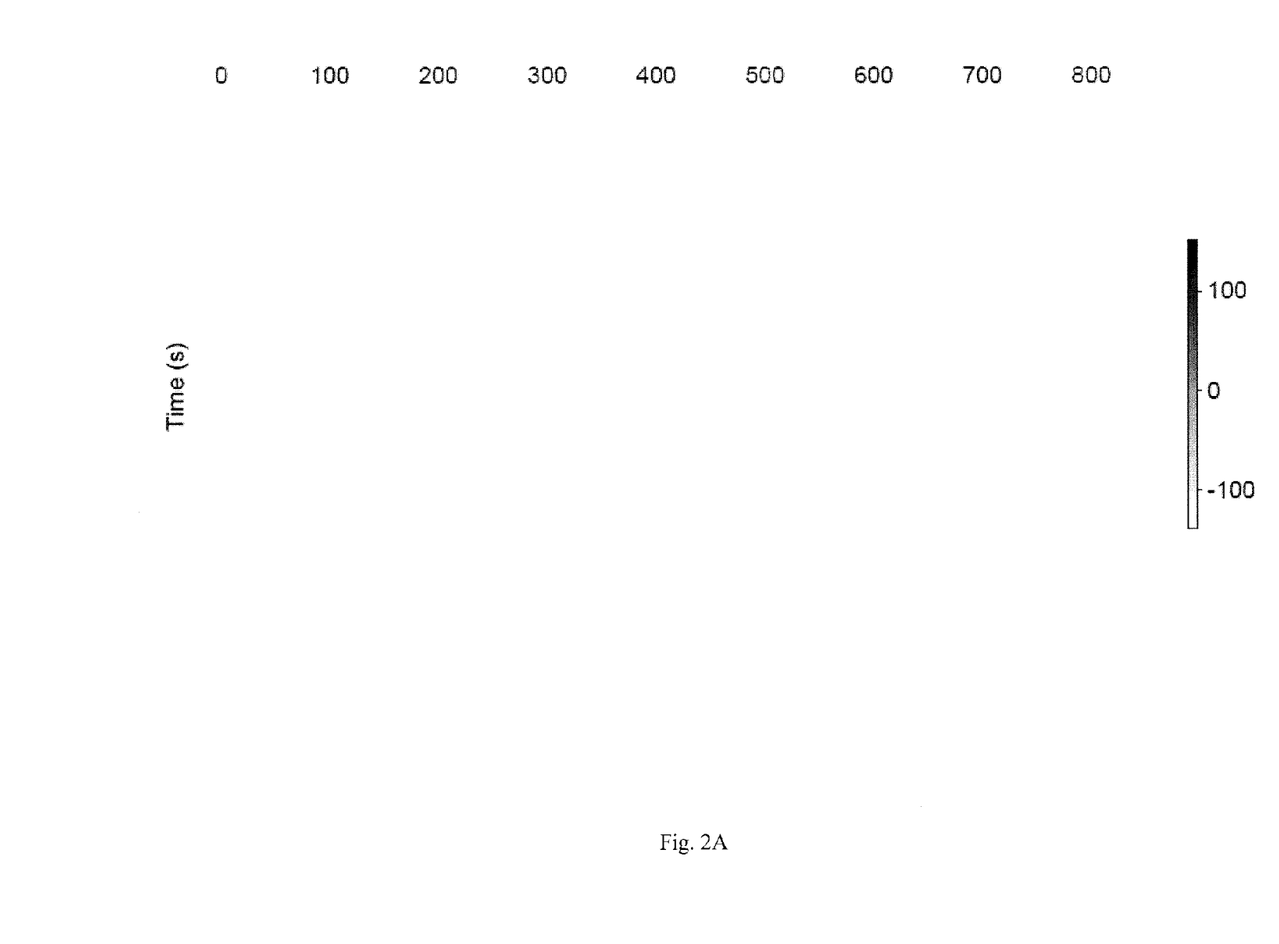
FIGS. 2A and 2B present a comparison of compression performance by different methods for a 50:1 compression (FIG. 2A) and a 10:1 compression (FIG. 2B)
Figure 2B:
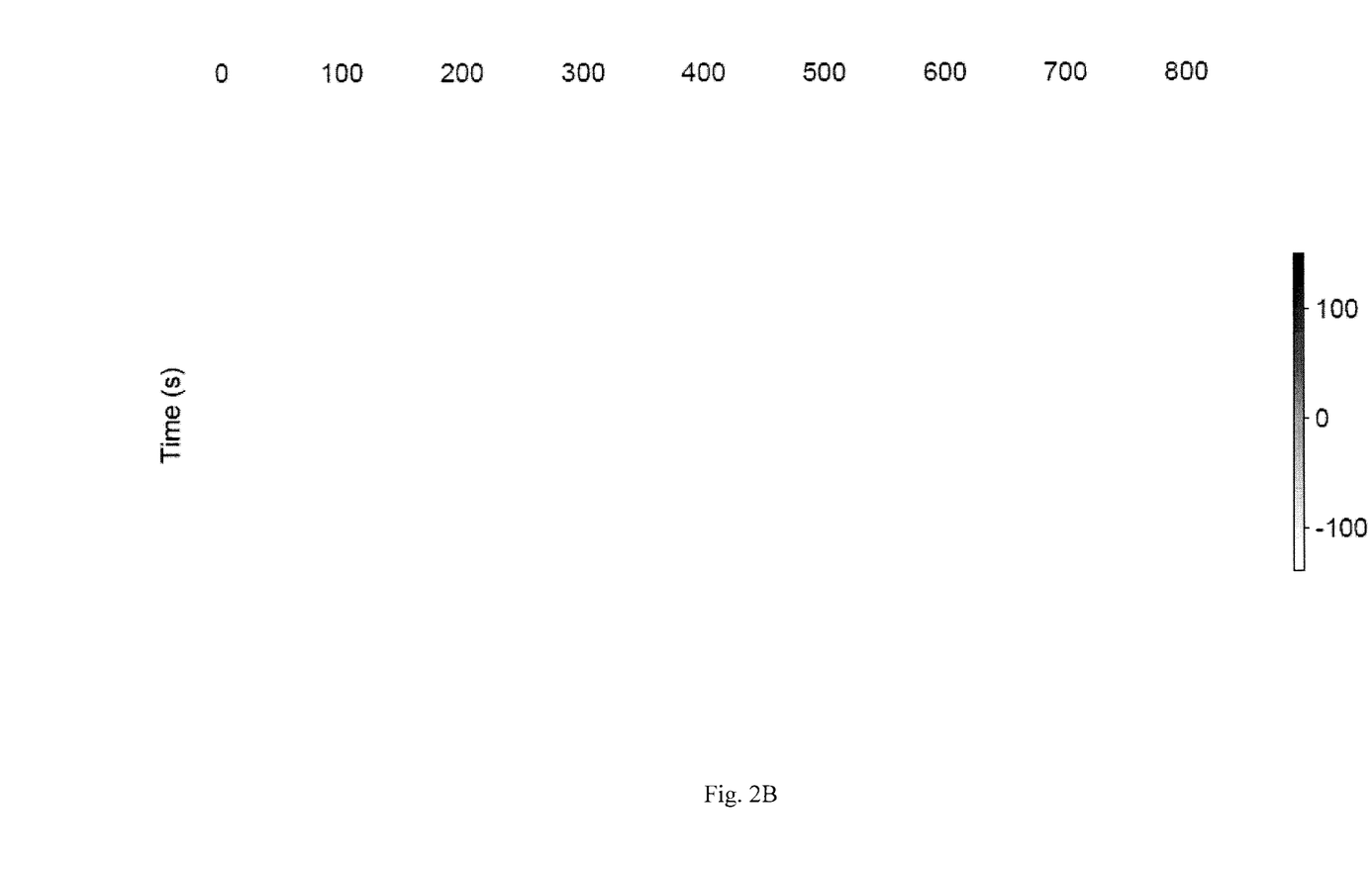

The panel of FIG. 2A shows the case of a compression of 50:1 while the panel of FIG. 2B is for a compression of 10:1. The rightmost plot in each panel is the original shot gather and the other three plots in each panel show the reconstructed shot gather by the three methods listed above, respectively.

Serious oscillating artifacts (mosaic phenomenon) along the edges for matching pursuit with Symlets are observed when the compression is 50:1 (see left most plot of FIG. 2A). The artifacts were dramatically reduced by including more coefficients in the matching pursuit, by lowering the compression (see the left most plot in bottom panel of FIG. 2B). But with the other two approaches which use either sub-space dictionary only or the combined dictionaries, no oscillating artifacts can be observed in the reconstructed data, no matter what compressions are used (see the middle two plots in both panels of FIGS. 2A and 2B). It can be seen visually that the matching pursuit with combined dictionaries reconstructed the original shot gather best, which can be further confirmed by the error analysis below.

Figure 3:
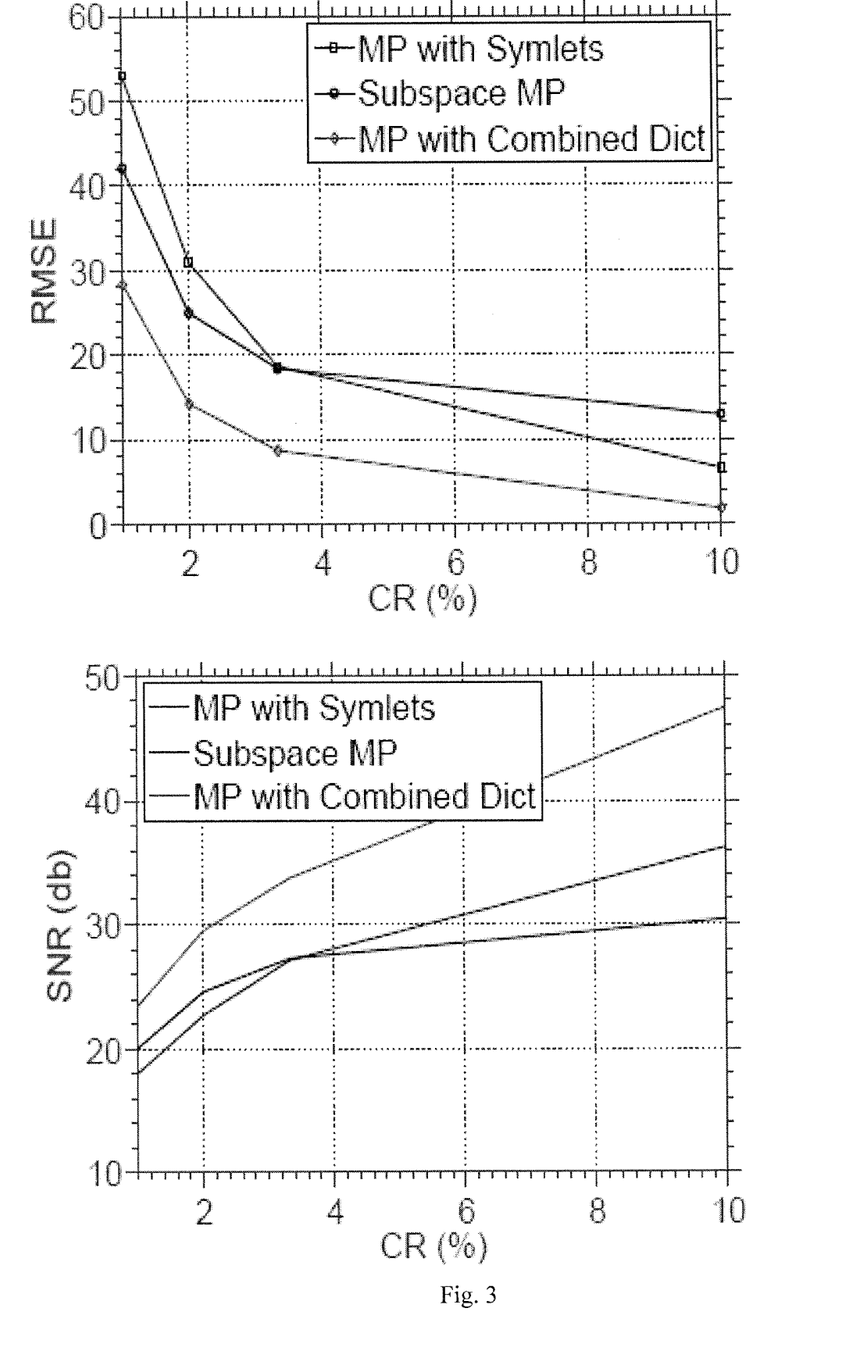
FIG. 3 illustrates error and signal to noise ratio (SNR) comparisons among these data compression methods.

The errors in reconstructed data and the signal-to-noise-ratio (SNR) are compared among the three different methods. It can be seen in FIG. 3 that the errors decrease when the size of compressed data increases, i.e., when the compression ratio increases. Matching pursuit with combined dictionaries had the smallest error among the methods, given a constant compression ratio. Signal to Noise Ratio (SNR) for all three methods increases with the compression ratio. The matching pursuit with combined dictionaries obtained the highest SNR.

The main difficulty in wavelet-based seismic data compression is to find an optimal wavelet dictionary which should be as compact as possible, yet it is complete such that all signals in the data can be represented by the wavelet basis in the dictionary. Most existing methods try to obtain such a dictionary in a pure mathematical perspective. Here a more optimal wavelet dictionary is found by the sub-space method which is based more on the basic physics of the seismic wave phenomena that the wavelets in the observed signals are the phase-rotated version of one common source wavelet. Since the dictionary has been educated according to the data to be compressed, it can be used to better represent the data. Therefore, the method is specifically tailored for the purpose of seismic data compression.

Another advantage of the method of this invention is that it is applied on a trace by trace basis, which makes it easily parallelized and it can achieve good efficiency for data processing.

The technique is very useful in handling large datasets, because seismic data volume from a typical seismic survey gets larger and larger. In principle, its impact can be expected wherever large data volumes are handled, such as, but not limited to, data transfer through networks, data visualization and angle gather computations in migration, etc. The technique increases the efficiency in data handling and reduces the cost of data storage.

What is claimed is:

1. A method for seismic exploration of the earth comprising the steps of
applying to the earth a seismic input signal which is characterized by a seismic source wavelet I(t),
recording a seismic trace f(t) in response to said seismic source wavelet, and
transforming said seismic source wavelet I(t) into
a zero-degree phase wavelet $\phi_p(t)$ and
a shifted 90 degree phase wavelet $\Psi_p(t)$,
where the wavelets $\phi_p(t)$ and $\Psi_p(t)$ span a two dimensional sub-space,
creating a sub-space dictionary as $$D_s = \{(\phi_p, \Psi_p)\} p \in \Gamma$$

where $\Gamma$ is a set of wavelets which are derived using $\phi_p(t)$ wavelet and $\Psi_p(t)$ wavelet, and
projecting said seismic trace f(t) onto
said dictionary $D_s$ to find the best matching projection, with a residual determined after each projection matching,
wherein the sum of said residuals determines the fidelity in data compression.

2. The method of claim 1 wherein
said two-dimensional sub-space can be expanded into a higher dimensional sub-space.

3. The method of claim 1 further comprising the step of
adding said sub-space dictionary $D_s$ into a conventional existing wavelet dictionary.

4. The method of claim 1 wherein
said conventional existing wavelet dictionary includes Symlets.

5. The method of claim 1 wherein,
$R^m f$ represents the residual after the m-th projection, with $R^0 f = f$, the initial residual being the response trace f(t) itself, and the m-th order residual $R^m f$ computed from $m \geq 0$,
where $(\phi_{pm}, \Psi_{pm}) \in D_s$,
finding a sub-set of the input wavelet $\phi_{pm}, \Psi_{pm}$ in the dictionary $D_s$ such that the m-th order residual has the biggest energy projected thereon such that, $$|\langle R^m f, \phi_{pm}\rangle| + |\langle R^m f, \Psi_{pm}\rangle| = \max(|\langle R^m f, \phi_p\rangle| + |\langle R^m f, \Psi_p\rangle|) p \in \Gamma,$$

projecting $R^m f$ on $(\phi_{pm}, \Psi_{pm})$, wherein $$R^m f = \langle R^m f, \phi_{pm}\rangle \phi_{pm} + \langle R^m f, \Psi_{pm}\rangle \Psi_{pm} + R^{m+1} f,$$

stopping at the m-th iteration when the norm of the residual satisfies $$\|R^m f\| \leq \epsilon \text{ where } \epsilon \text{ is a predefined small, positive value,}$$

and the compressed wave is represented by $$f = \sum_{m=0}^{M-1} (\langle R^m f, \phi_{pm}\rangle \phi_{pm} + \langle R^m f, \Psi_{pm}\rangle \Psi_{pm}) + R^M f.$$

* * * * *

UNITED STATES PATENT AND TRADEMARK OFFICE
CERTIFICATE OF CORRECTION

| | | Page 1 of 3 |
|---|---|---|
| PATENT NO. | : 8,981,971 B2 | |
| APPLICATION NO. | : 14/224916 | |
| DATED | : March 17, 2015 | |
| INVENTOR(S) | : QingQing Liao et al. | |

It is certified that error appears in the above-identified patent and that said Letters Patent is hereby corrected as shown below:

In the drawings

-- On Sheet 2/4, replace Fig 2A with complete Fig. 2A (attached).

-- On Sheet 3/4, replace Fig. 2B with complete Fig. 2B (attached).

Signed and Sealed this
Twenty-fourth Day of May, 2016

Michelle K. Lee
*Director of the United States Patent and Trademark Office*

Fig. 2A

Fig. 2B